(12) United States Patent
Kellner-Werdehausen et al.

(10) Patent No.: US 6,963,088 B2
(45) Date of Patent: Nov. 8, 2005

(54) SEMICONDUCTOR COMPONENT

(76) Inventors: Uwe Kellner-Werdehausen, Mühlgasse 16, 91359 Leutenbach (DE); Franz-Josef Niedernostheide, Fuchsweg 16, 48157 Münster (DE); Hans-Joachim Schulze, Ottostrasse 60f, 85521 Ottobrunn (DE); Frank Pfirsch, Säbener Strasse 230, 84545 München (DE)

( * ) Notice: Subject to any disclaimer, the term of this patent is extended or adjusted under 35 U.S.C. 154(b) by 0 days.

(21) Appl. No.: 10/797,246

(22) Filed: Mar. 10, 2004

(65) Prior Publication Data

US 2004/0169256 A1 Sep. 2, 2004

Related U.S. Application Data

(63) Continuation of application No. PCT/EP03/07059, filed on Jul. 2, 2003.

(30) Foreign Application Priority Data

Jul. 10, 2002 (DE) .......................................... 102 31 199

(51) Int. Cl.[7] .............................................. H01L 29/74
(52) U.S. Cl. ....................... 257/175; 257/157; 257/158; 257/166; 257/176
(58) Field of Search ................................. 257/148, 154, 257/157–161, 164, 168, 173–176, 536, 540

(56) References Cited

U.S. PATENT DOCUMENTS

| 5,204,273 A | * | 4/1993 | Kuhnert et al. | .............. 438/137 |
| 5,550,392 A | | 8/1996 | Evans | ......................... 257/170 |
| 6,066,864 A | * | 5/2000 | Ruff et al. | .................. 257/175 |

FOREIGN PATENT DOCUMENTS

| DE | 196 40 311 A1 | 4/1998 | ......... H01L/29/744 |
| DE | 196 50 762 A1 | 7/1998 | ........... H01L/29/74 |
| EP | 0 472 880 A2 | 7/1991 | ......... H01L/29/743 |
| WO | WO 86/00469 | 1/1986 | ........... H01L/29/74 |

* cited by examiner

Primary Examiner—Donghee Kang

(57) ABSTRACT

A semiconductor component is arranged in a semiconductor body and has at least one integrated radially symmetrical lateral resistance having a location-dependent sheet resistance, the radial dependence of which is preferably configured such that the differential resistance dR is radially constant or the power dissipated in the resistance is radially constant.

20 Claims, 3 Drawing Sheets

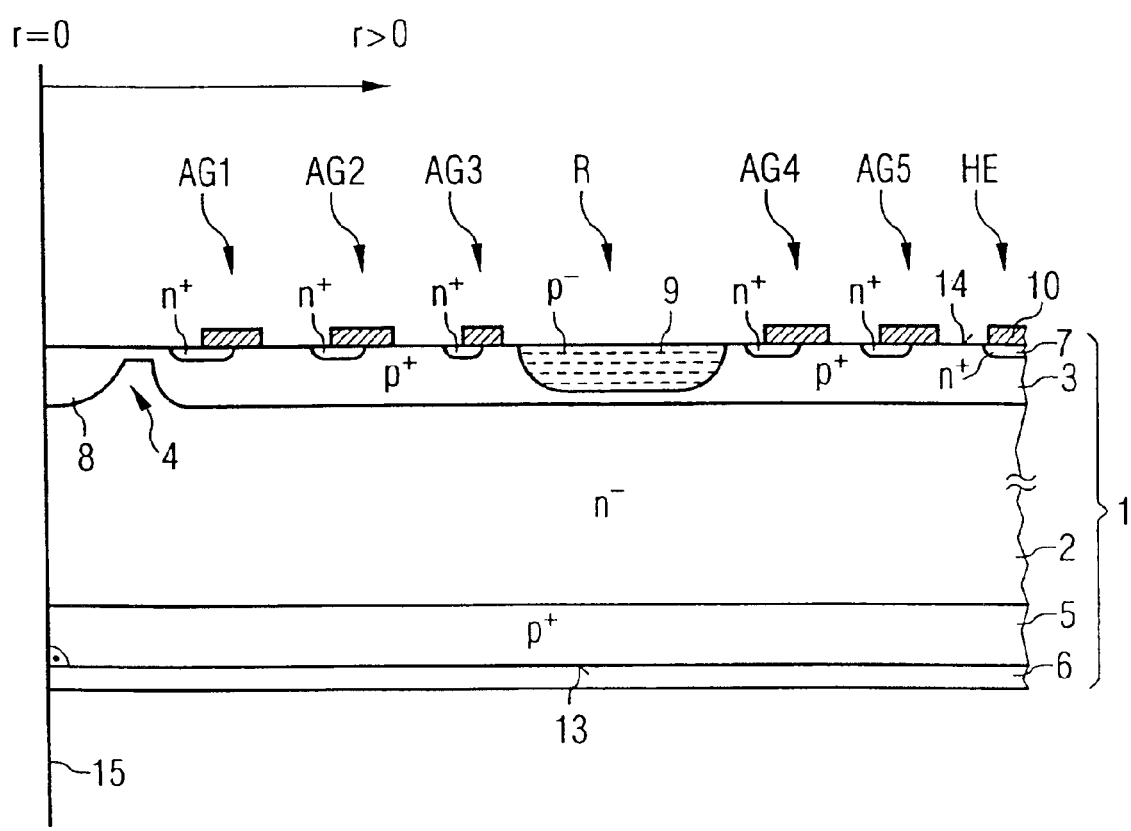

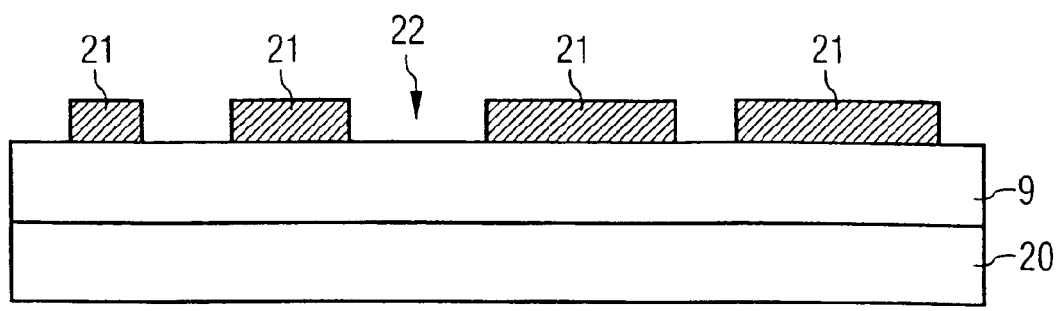
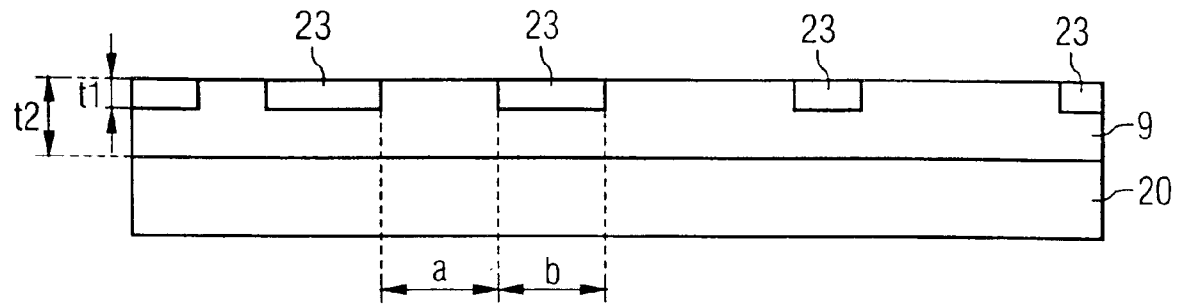

SEMICONDUCTOR COMPONENT

CROSS REFERENCE TO RELATED APPLICATION

This application is a continuation of copending International Application No. PCT/EP03/07059 filed Jul. 2, 2003 which designates the United States, and claims priority to German application no. 102 31 199.4 filed Jul. 10, 2002.

TECHNICAL FIELD OF THE INVENTION

The present invention relates to a semiconductor component arranged in a semiconductor body and having at least one integrated lateral resistance.

DESCRIPTION OF THE RELATED ART

Such semiconductor components may be formed in any desired manner, in other words a thyristor, an IGBT, a MOSFET, a J-FET, a bipolar transistor or simply a resistance structure in a semiconductor layer formed in whatever fashion may be involved here. The construction and the method of operation of such semiconductor components are known in many cases, so that a detailed description of these semiconductor components can be dispensed with here. A thyristor having a resistance structure formed in radially symmetrical fashion shall be assumed as an example of a semiconductor component in the text below, but without restricting the invention to this semiconductor component.

Integrated resistances play a major part in power semiconductor components generally and in high-voltage thyristors in particular. They are implemented for example in thyristor structures having a so-called amplifying gate structure in order to limit the rate of current rise when the thyristor is switched on. Without integrated resistances, such thyristor structures risk being destroyed.

The construction of a thyristor having an amplifying gate structure is described for example in the German patent DE 42 15 378 C1. An exemplary further development of this thyristor structure is described in DE 196 50 762 A1, in particular in FIGS. 1, 3 and 4 therein. Furthermore, high-power thyristors and methods for realizing integrated resistances in thyristors are described in an article by V.A.K. Temple, "Advanced Light Triggered Thyristor for Electric Power Systems", IEEE International Conference Thyristors and Variable and Static Equipment for AC and DC Transmission (1981).

In thyristor structures, integrated resistances have the purpose of limiting the current through one or more of the so-called amplifying gate stages in order thus to prevent possible destruction of the component under extreme switching conditions. A thyristor having an amplifying gate structure is usually constructed in radially symmetrical fashion. The main emitter is arranged concentrically around one or more auxiliary emitters, with which contact is made via auxiliary emitter electrodes or so-called amplifying gate electrodes. An integrated lateral resistance may be provided between one or more of the said amplifying gate electrodes for the purpose of protecting the thyristor, said lateral resistance being arranged in a resistance region provided specifically for this. The amplifying gate electrodes are typically formed in annular fashion. As a result of this, the integrated lateral resistance is preferably also of radially symmetrical form. The value of the integrated lateral resistance R depends on the one hand on the sheet resistance $R_s$ and, on the other hand, on the internal radius $r_i$ and external radius $r_a$ of the resistance region. In the case of radially symmetrical resistance structures, the following thus holds true for the integrated lateral resistance R:

$$R = \int_{R(r_i)}^{R(r)} dR = \int_{r_i}^{r_a} \frac{R_s}{2\pi r} dr = \frac{R_s}{2\pi} \ln\left(\frac{r_a}{r_i}\right) \quad (1)$$

The following then holds true for the differential resistance dR(r) of a radially symmetrical resistance structure:

$$dR(r) = \frac{R_s}{2\pi r} dr. \quad (2)$$

The sheet resistance $R_s$ depends on the doping concentration and also the mobility of the charge carriers in the semiconductor layer. In the case of a resistance layer produced by diffusion, the sheet resistance $R_s$ is set e.g. by means of a doping coating and also the chosen diffusion parameters (temperature, duration of the diffusion). The sheet resistance is thus constant in the case of a homogeneously doped resistance structure.

However, radially symmetrical lateral resistances often comprise an annular resistance region containing one or more annular inhomogeneous resistance regions. The European patent EP 472 880 B1, in particular FIGS. 1 and 2 thereof, discloses a thyristor having such a lateral inhomogeneous resistance structure and a method for producing said thyristor. In that case, these radially symmetrical inhomogeneities are arranged at equidistant distances from one another and also have an identical ring thickness.

The problem in the case of such a radially symmetrical resistance structure is that the differential resistance dR(r), given a location-independent sheet resistance, becomes ever smaller as the radius r increases. Such a radial dependence of the differential resistance dR is particularly serious when the lateral resistance R is subjected to extremely high loading under specific switching conditions, in particular at high currents and/or voltages. On account of the location dependence of the differential resistance, the inner resistance regions, which have a significantly higher differential resistance compared with the outer resistance regions, dissipate a correspondingly higher power. The higher dissipated power at these places leads to an additional temperature increase which effects the temperature behavior both of the lateral resistance itself and of the protective voltage set by the BOD region. Since the values of the lateral resistance and of the protective voltage depend on the temperature, any further temperature increase in the component itself leads to an alteration of these set values. Under extreme conditions, that is to say at high currents and/or voltages, the lateral resistance is therefore overloaded there and thermally destroyed, which, understandably, should be avoided under all circumstances.

SUMMARY OF THE INVENTION

Therefore, the present invention is based on the object of realizing a preferably radial location dependence of the sheet resistance $R_s$ in such a way that, in addition to the requirement made of the total resistance R, a further requirement made of a second physically relevant parameter is satisfied.

The object can be achieved by means of a semiconductor component arranged in a semiconductor body comprising at least one integrated radially symmetrical lateral resistance, wherein the differential resistance dR of the lateral resistance R is formed in location-independent fashion in such a way that the following holds true:

$dR/dr \approx K,$ where dr is the differential radius of the lateral resistance and K is an arbitrary constant.

The sheet resistance Rs can be configured in radially location-dependent fashion. The differential resistance dR can be radially constant. The power dissipated in the resistance can be radially constant. The lateral resistance can be arranged in a homogeneously doped resistance region of the semiconductor component, the resistance region having radially symmetrical inhomogeneities, which have a different electrically active doping concentration by comparison with the doping of the resistance region. The radially symmetrical inhomogeneities may have an increased sheet resistance, produced by irradiation, compared to the resistance region. The radially symmetrical inhomogeneities may have a higher doping concentration, produced by additional doping, than the resistance region. The width or the diameter of the spatial inhomogeneities can decrease as the radius r increases. The distance between the radially symmetrical inhomogeneities may increase in the radial direction as the radius r increases. The electrically active doping concentration of the radially symmetrical inhomogeneities may decrease as the radius r increases. The depth with which the radially symmetrical inhomogeneities have been introduced into the semiconductor body, so that the sheet resistance is locally increased, can increase as the radius r increases. The depth with which the resistance region has been introduced into the semiconductor body can decrease as the radius r increases. The radially symmetrical inhomogeneities, in the projection of the surface of the semiconductor component, can be formed as concentric annuli. The inhomogeneities, in the projection of the surface of the semiconductor component, can be formed as points or circles which are arranged concentrically. The semiconductor component can be formed as a thyristor, in particular as a high-voltage thyristor. The thyristor can be formed in radially symmetrical fashion and may have, in particular, radially symmetrical emitter regions.

A realization according to the invention comprises a semiconductor component of the generic type having a location-independent differential resistance, that is to say, by way of example, a sheet resistance $R_s$ that is linearly dependent on r. As an alternative, it might be possible to provide a differential resistance which is made such that the power dissipated in the resistance is no longer dependent (or is only weakly dependent) on the radial component. In both cases proposed, the thermal loadability is also significantly improved since the radially inner resistance region is relieved by a greater resistance contribution of the outer regions.

The following explanations relate to the realization of a semiconductor component of the generic type in which the differential resistance dR of the lateral resistance is formed in location-independent fashion. The following holds true:

$$dR/dr \approx K,$$

where dr designates the differential radius of the lateral resistance and K denotes an arbitrary constant.

The differential resistance that is constant to the greatest possible extent is typically set by means of inhomogeneities arranged in the resistance region. Said inhomogeneities are arranged preferably in radially symmetrical fashion in the resistance region and have a different electrically active doping concentration e.g. compared with the doping of the remaining, homogeneously doped resistance regions.

The radially symmetrical inhomogeneities may be formed as follows:

The inhomogeneities have a locally altered (preferably increased) sheet resistance, as a result of irradiation, compared to the original resistance region.

The inhomogeneities have an altered, preferably higher doping concentration, as a result of doping, for example diffusion or implantation, compared to the resistance region.

Radially symmetrical inhomogeneities in which the resistance is locally decreased or the doping is locally increased may be realized by one or more of the following measures:

The width or the diameter of the inhomogeneities decreases as the radius increases.

The distance between the inhomogeneities increases in the radial direction as the radius increases.

The electrically active doping concentration of the inhomogeneities decreases as the radius increases.

If, as the depth with which the regions with inhomogeneities project into the semiconductor body increases, the sheet resistance is increased locally at the respective inhomogeneities (e.g. by local irradiation or etching), then said depth increases as the radius increases.

The radially symmetrical inhomogeneities may assume the following forms in the projection of the surface of the semiconductor body:

The inhomogeneities are formed as concentric annuli.

The inhomogeneities are formed as points or circles which are arranged concentrically around the center point of the radially symmetrical semiconductor component. Other geometries (besides points, circles) are also conceivable, in principle.

The semiconductor component itself is advantageously formed as a thyristor, in particular as a high-voltage thyristor. Furthermore, in a highly advantageous refinement, the thyristor is formed in radially symmetrical fashion and has, in particular, radially symmetrical emitter regions.

BRIEF DESCRIPTION OF THE DRAWINGS

The invention is explained in more detail below with reference to the exemplary embodiments specified in the figures of the drawing, in which:

FIG. 1 shows a partial section of an amplifying gate structure of a thyristor having an integrated resistance according to the invention;

FIG. 2 shows, using partial sections (a)–(b), a first method for realizing an integrated lateral resistance having a location-independent differential resistance;

DETAILED DESCRIPTION OF THE PREFERRED EMBODIMENTS

Figure 3A:
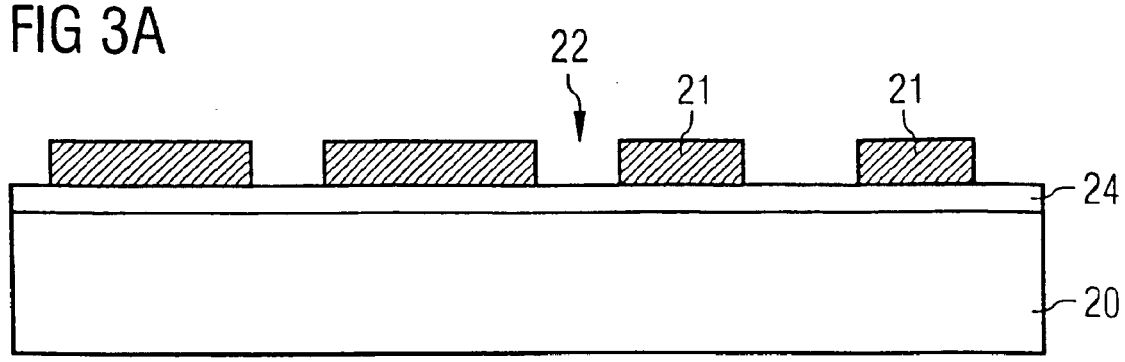
FIG. 3 shows, using partial sections (a)–(c), a second method for realizing an integrated lateral resistance having a location-independent differential resistance.

FIG. 1 shows a partial section of a thyristor known from DE 196 50 762 A1, which was mentioned in the introduction. A semiconductor body 1, for example a silicon wafer, contains an $n^-$-doped anodal base zone 2. On the anode side, a $p^+$-doped emitter zone 5 adjoins the base zone 2. Electrical contact is made with the emitter zone 5 at the rear side 13 of the wafer in large-area fashion via an anode electrode 6. A p-doped base zone 3 adjoins on the cathode side. The base zone 3 contains a cutout 4, the base zone 3, in the central region 8 of the thyristor defining a region having a reduced breakdown voltage by means of its geometry. Such a region having a reduced breakdown voltage is also known as BOD region to the person skilled in the art and is used in particular in so-called breakover thyristors.

On the cathode side, n⁺-doped emitter zones 7 are embedded in the base zone 3, which emitter zones may be, by way of example, the auxiliary emitter zones of auxiliary thyristors. Contact is made with the emitter zones 7 by means of emitter electrodes 10. Moreover, the emitter electrodes 10 also make contact with the base zone 3 at the outer side.

The semiconductor component is constructed in rotationally symmetrical fashion with respect to the axis 15, which is perpendicular to the two surfaces 13, 14 of the semiconductor body 1 which runs in the central region 8 of the semiconductor component. The cathodal base zone 3 and the emitter zones 7 and also the corresponding electrodes 10 are formed in circular fashion or annular fashion in the plane of the surface of the semiconductor body 1. The thyristor according to the invention is preferably a ring thyristor. The illustrated forms of the above-mentioned zones and layers 3 to 8 are not mandatory, however. They may also deviate from the circular form or annular form and be shaped in polygonal fashion, for example.

The thyristor illustrated in the partial section in FIG. 1 furthermore has a customary amplifying gate structure and an integrated lateral resistance R arranged in a resistance region 9. The integrated resistance region 9 is situated between two auxiliary emitters of the amplifying gate structure, to be precise between the third and fourth amplifying gates AG3, AG4. The resistance region 9 has radially symmetrical, inhomogeneous resistance regions (not illustrated in FIG. 1) in such a way that the differential resistance of the lateral resistance R is thereby location-independent, i.e. constant.

Such inhomogeneous resistance regions, which are also referred to below as inhomogeneities within the resistance region 9, may be formed for example as follows:

The resistance region 9 comprises a plurality of annular resistance rings.

The resistance region 9 contains annular in-homogeneous regions which have an increased or decreased sheet resistance compared with the remaining regions of the resistance region 9 and have been produced by local doping, irradiation or etching.

The way in which it is possible to produce this resistance region 9 according to the invention with a constant differential resistance is described below with reference to two exemplary embodiments.

Exemplary Embodiment 1:

FIG. 2(a) shows a silicon layer 20 arranged in a semiconductor body 1, in which the radially homogeneously doped resistance region 9 is embedded. An arbitrary mask 21, for example made of silicon dioxide or photoresist, has been applied to the surface of the semiconductor body 1 in the region of the resistance region 9. The uncovered regions of the mask 22 define radially symmetrical, annular regions.

FIG. 2(b) shows the continuation of the realization of the resistance region 9 according to the invention from FIG. 2(a). After a suitable process step, for example an irradiation, a diffusion, an implantation or the like, the radially symmetrical annular inhomogeneities 23 are produced within the resistance region 9. Said inhomogeneities 23 either have an increased defect density, produced by irradiation, and thus a higher resistance or may alternatively have a higher doping concentration, brought about by diffusion or ion implantation of doping elements of the same conduction type, and thus a lower resistance.

In the former case, in order to obtain a spatially inhomogeneous lateral resistance, a radially constant sheet resistance in the resistance region is taken as a basis, the resistance region being irradiated with ions by means of a correspondingly patterned mask. As a result, defects are produced in the resistance region 9 at the places of the irradiation, so that the conductivity is reduced at said places. In the case of an annular resistance region, by way of example, a typical mask form forms an arrangement with concentric rings, the width b of the inhomogeneities 23 embedded therein increasing outwardly and/or in the case of which the ring distance a decreases outwardly. In this case, the respective widths b and distances a are adapted so as to satisfy the required properties according to the radially constant differential resistance. By means of this measure, in contrast to the radially homogeneous lowering of the sheet resistance as described in the German patent application DE 19 640 311.1 (by H.-J. Schulze), the radial profile of the sheet resistance is modified in such a way that an electrical voltage dropped across the resistance is distributed more uniformly over the resistance and, consequently, the power dissipated in the resistance is also distributed better radially.

Besides the annular geometries mentioned, a series of further mask geometries are conceivable, such as correspondingly arranged perforated masks, for example, which are likewise arranged in approximately radially symmetrical fashion. It is also conceivable to design the mask 21 as a mask with correspondingly spatial thickness variations, so that a greater absorption of the radiation takes place at the places of increased thickness than at places of smaller thickness, as a result of which a lower defect density and thus a lower resistance is generated at the places of higher thickness. While the mask form is essentially determined by the spatial profile of the resistance, the absolute resistance value of the lateral resistance may furthermore be set very precisely by means of an additional spatial homogeneous irradiation.

In the paragraph above, the inhomogeneities were in each case brought about by the production of defects. In the case of inhomogeneities which are produced by implantation or diffusion and in the case of which the doping is increased locally, the opposite procedure is to be effected with regard to the distances a between the annuli and the width b thereof.

Furthermore, in order to produce a constant differential resistance, it might also be possible to vary the depths t1, t2 of the inhomogeneities 23 and/or of the resistance region 9 in a suitable manner.

Exemplary Embodiment 2:

In FIG. 3(a), a homogeneous dopant coating 24 is applied on the surface of the silicon layer 20. A patterned mask 21, having the function of an etching barrier, is in turn applied on said dopant coating.

Figure 3B:
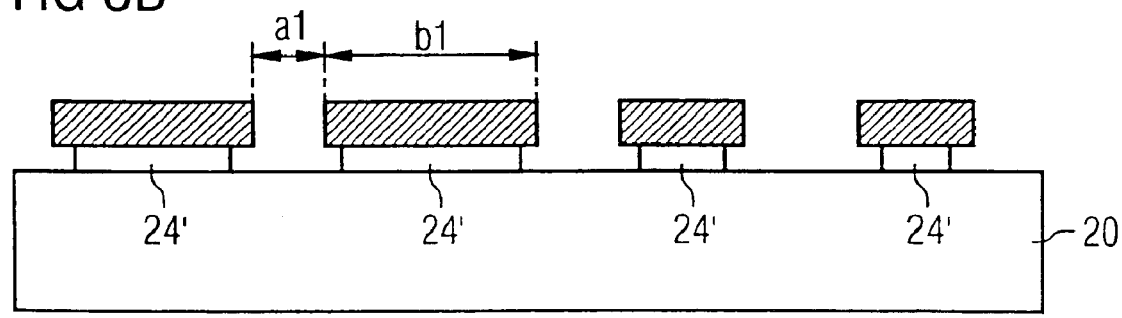

FIG. 3(b) shows the continuation of the realization of the resistance region 9 according to the invention from FIG. 3(a), in which the semiconductor body 1 is exposed to an etching process—this is a wet-chemical etching process in the example in FIG. 3(b). By means of the etching, the uncovered regions 22 of the dopant coating 24 are etched away. The regions of the dopant coating 24 below the mask 21 remaining, with the exception of a greater or lesser undercut, and forming a patterned dopant coating 24'.

Figure 3C:
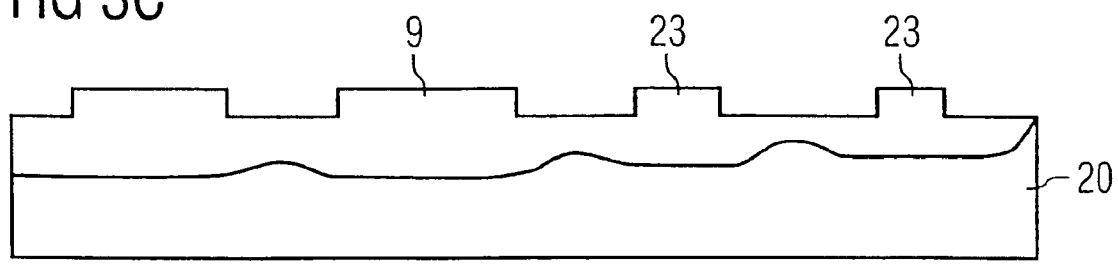

FIG. 3(c) shows the continuation of the realization from FIG. 3(b). Here, the silicon layer 20 is illustrated after a diffusion process in which dopants diffuse from the patterned dopant coating 24' into the layer 20, where they can form the spatially patterned resistance region 9.

The integrated approximately location-independent resistance with a location-dependent sheet resistance as outlined in FIG. 3 is advantageously the result of a doping element which diffuses relatively rapidly. In the case of a p-doped resistance region, said element may be formed by aluminum, for example.

The absolute resistance value can be set by the coating value, the diffusion time chosen and the diffusion temperature. In addition, it is possible, of course, for the entire process course to be preceded by a previous, nonmasked doping process (diffusion or implantation) for producing a homogeneous basic doping.

A further alternative possibility in the context of the second exemplary embodiment for producing a resistance profile with specific spatial properties consists in the doping elements being distributed radially inhomogeneously in the semiconductor body 1 by means of a masked ion implantation (or else diffusion) instead of by means of a masked dopant coating. In this case, a mask, for example made of silicon dioxide ($SiO_2$), silicon nitride ($Si_3N_4$) or photoresist, ensures that the dopant to be diffused can only penetrate locally into the semiconductor body 1 during the doping phase (implantation or diffusion). Local doping wells are thereby produced in the semiconductor body 1. Afterward, the dopant is indiffused further into the semiconductor body 1.

In the case of an annular resistance region 9, what is appropriate for the structure of the etching mask 21 is once again an arrangement of concentric rings whose width (b1) decreases outwardly in order to obtain a radially constant differential resistance and/or in the case of which the ring distance (a1) increases outwardly. By means of this measure, in contrast to the setting of the sheet resistance with radially unaltered parameters a1 and b1, as described in the European patent application EP 0 472 880 (by Kuhnert, Mitlehner, Schulze, Pfirsch), the radial profile of the sheet resistance is modified in such a way that an electrical voltage dropped across the resistance is distributed more uniformly over the resistance and, consequently, the power dissipated in the resistance is also distributed better radially. The final resistance profile is produced by means of a concluding diffusion step.

The invention shall not be exclusively restricted to the exemplary embodiments shown in FIGS. 1 to 3. Rather, a multiplicity of new variants can be specified there, for example by interchanging the conductivity types n for p and vice versa and also by varying the doping concentrations. The above-described different methods for producing a semiconductor component having an integrated, inhomogeneous resistance region may also be combined and can be applied both to n-conducting and p-conducting resistance regions. In principle, it is possible to employ the methods according to the invention for realizing any type of semiconductor component. The methods described are particularly preferably used for producing a thyristor. Furthermore, it goes without saying that many other known methods for producing the radially symmetrical resistance structures with a constant differential resistance could additionally be specified, which lie within the scope of the technical knowledge of a person skilled in the art.

What is claimed is:

1. A semiconductor component arranged in a semiconductor body comprising at least one integrated radially symmetrical lateral resistance, wherein the differential resistance dR of the lateral resistance R is formed in location-independent fashion through a homogeneously doped resistance region of the semiconductor component, the resistance region having radially symmetrical inhomogeneities, which have a different electrically active doping concentration by comparison with the doping of the resistance region, wherein the following holds true:

$$dR/dr \approx K,$$

where dr is the differential radius of the lateral resistance and K is an arbitrary constant.

2. The semiconductor component as claimed in claim 1, wherein the sheet resistance Rs is configured in radially location-dependent fashion.

3. The semiconductor component as claimed in claim 2, wherein the differential resistance dR is radially constant.

4. The semiconductor component as claimed in claim 2, wherein the power dissipated in the resistance is radially constant.

5. The semiconductor component as claimed in claim 1, wherein the radially symmetrical inhomogeneities have an increased sheet resistance, produced by irradiation, compared to the resistance region.

6. The semiconductor component as claimed in claim 1, wherein the radially symmetrical inhomogeneities have a higher doping concentration, produced by additional doping, than the resistance region.

7. The semiconductor component as claimed in claim 1, wherein the width or the diameter of the spatial inhomogeneities decreases as the radius r increases.

8. The semiconductor component as claimed in claim 1, wherein the distance between the radially symmetrical inhomogeneities increases in the radial direction as the radius r increases.

9. The semiconductor component as claimed in claim 1, wherein the electrically active doping concentration of the radially symmetrical inhomogeneities decreases as the radius r increases.

10. The semiconductor component as claimed in claim 1, wherein the depth with which the radially symmetrical inhomogeneities have been introduced into the semiconductor body, so that the sheet resistance is locally increased, increases as the radius r increases.

11. The semiconductor component as claimed in claim 1, wherein the depth with which the resistance region has been introduced into the semiconductor body decreases as the radius r increases.

12. The semiconductor component as claimed in claim 1, wherein the radially symmetrical inhomogeneities, in the projection of the surface of the semiconductor component, are formed as concentric annuli.

13. The semiconductor component as claimed in claim 1, wherein the inhomogeneities, in the projection of the surface of the semiconductor component, are formed as points or circles which are arranged concentrically.

14. The semiconductor component as claimed in claim 1, wherein the semiconductor component is formed as a thyristor, in particular as a high-voltage thyristor.

15. The semiconductor component as claimed in claim 14, wherein the thyristor is formed in radially symmetrical fashion and has, in particular, radially symmetrical emitter regions.

16. A semiconductor component arranged in a semiconductor body comprising at least one integrated radially symmetrical lateral resistance, wherein the differential resistance dR of the lateral resistance R is formed in location-independent fashion through a homogeneously doped resistance region of the semiconductor component, the resistance region having radially symmetrical inhomogeneities, which have a different electrically active doping concentration by comparison with the doping of the resistance region.

17. The semiconductor component as claimed in claim 16, wherein the radially symmetrical inhomogeneities have an increased sheet resistance, produced by irradiation, compared to the resistance region.

18. The semiconductor component as claimed in claim 16, wherein the radially symmetrical inhomogeneities have a higher doping concentration, produced by additional doping, than the resistance region.

19. The semiconductor component as claimed in claim 16, wherein the width or the diameter of the spatial inhomogeneities decreases as the radius r increases.

20. A method of manufacturing a semiconductor component comprising the steps of:
- providing a semiconductor body;
- forming at least one integrated radially symmetrical lateral resistance in said semiconductor body, wherein the differential resistance dR of the lateral resistance R is formed in location-independent fashion by homogeneously doping a resistance region of the semiconductor component, the resistance region having radially symmetrical inhomogeneities, which have a different electrically active doping concentration by comparison with the doping of the resistance region.

* * * * *